(12) United States Patent
Cadwell et al.

(10) Patent No.: US 7,736,437 B2
(45) Date of Patent: Jun. 15, 2010

(54) BAFFLED LINER COVER

(75) Inventors: Tom L. Cadwell, Los Altos, CA (US); Michael Sklyar, San Jose, CA (US)

(73) Assignee: Integrated Materials, Incorporated, Sunnyvale, CA (US)

( * ) Notice: Subject to any disclaimer, the term of this patent is extended or adjusted under 35 U.S.C. 154(b) by 69 days.

(21) Appl. No.: 11/554,154

(22) Filed: Oct. 30, 2006

(65) Prior Publication Data

US 2007/0181066 A1 Aug. 9, 2007

Related U.S. Application Data

(60) Provisional application No. 60/765,013, filed on Feb. 3, 2006.

(51) Int. Cl.
*C23C 16/00* (2006.01)

(52) U.S. Cl. .................................................. 118/715

(58) Field of Classification Search .................. 118/715
See application file for complete search history.

(56) References Cited

U.S. PATENT DOCUMENTS

| | | | |
|---|---|---|---|
| 5,279,670 A | 1/1994 | Watanabe et al. | |
| 5,417,803 A | 5/1995 | Goldstein et al. | |
| 5,858,103 A * | 1/1999 | Nakajima et al. | 118/728 |
| 5,902,103 A | 5/1999 | Maeda et al. | 432/253 |
| 6,156,121 A | 12/2000 | Hasebe et al. | |
| 6,194,030 B1 * | 2/2001 | Psaute | 427/248.1 |
| 6,495,473 B2 * | 12/2002 | Taniyama et al. | 438/758 |
| 6,663,025 B1 * | 12/2003 | Halsey et al. | 239/554 |
| 6,984,267 B2 | 1/2006 | Irino et al. | |
| 7,083,694 B2 | 8/2006 | Boyle et al. | 156/89.11 |
| 2002/0129901 A1 * | 9/2002 | Fujikawa et al. | 156/345.31 |
| 2004/0129203 A1 | 7/2004 | Zehavi et al. | 228/121 |
| 2004/0266158 A1 * | 12/2004 | Boyle et al. | 438/612 |
| 2006/0185589 A1 | 8/2006 | Zehavi et al. | 228/174 |

* cited by examiner

*Primary Examiner*—Michael Cleveland
*Assistant Examiner*—Keath T Chen
(74) *Attorney, Agent, or Firm*—Charles S. Guenzer

(57) ABSTRACT

A baffled liner cover supported at the top of a liner surrounding a wafer support tower for semiconductor thermal processing. The cover may present a continuous horizontal surface for preventing particles from falling within the liner but present horizontal extending gas passageways in a baffle assembly to allow the flow of processing gas through the cover. In one embodiment, the baffle assembly includes a cup-shaped member disposed in a central aperture of a top plate having an open top, a continuous bottom, horizontal holes through the sides, and a flange around sides defining a convolute annular passage. Alternatively, the planar top plate may included slanted holes therethrough or vertical holes occupying a small fraction of the surface area. The liner and cover may be composed of quartz, silicon carbide, or preferably silicon.

16 Claims, 4 Drawing Sheets

BAFFLED LINER COVER

FIELD OF THE INVENTION

The invention relates generally to equipment used in thermal processing of substrates. In particular, the invention relates to a generally tubular liner used for semiconductor processing in a thermal oven.

BACKGROUND OF THE INVENTION

Batch thermal processing continues to be used for several stages of fabrication of silicon integrated circuits. One low temperature thermal process deposits a layer of silicon nitride by chemical vapor deposition, typically using chlorosilane and ammonia as the precursor gases at temperatures in the range of about 700° C. Other, high-temperature processes include oxidation, annealing, silicidation, and other processes typically using higher temperatures, for example above 1000° C. or even 1350° C.

For large-scale commercial production, vertical furnaces and vertically arranged wafer towers supporting a large number of wafers in the furnace are typically used, often in a configuration illustrated in the schematic cross-sectional view of FIG. 1. A furnace 10 includes a thermally insulating heater canister 12 supporting a resistive heating coil 14 powered by an unillustrated electrical power supply. A bell jar 16, typically composed of quartz, includes a domed roof 18 and fits within the heating coil 14. An open-ended liner 20 fits within the bell jar 16. A support tower 22 sits on a pedestal 24 and during processing the pedestal 24 and the support tower 22 are generally surrounded by the liner 20. The tower 22 includes three or four vertically extending legs 26 fixed at the ends to a tower top plate 28 and a tower bottom plate 30. The legs 26 include vertically arranged slots 32 for holding multiple vertically arranged and horizontally disposed wafers 34 to be thermally processed in batch mode. If used, one or more gas injectors 36 principally disposed between the liner 20 and the tower 22 have multiple gas outlets 38 at different heights for injecting processing gas within the liner 18. An unillustrated vacuum pump removes the processing gas through the bottom of the bell jar 16. Conventionally, the top of the liner 20 is left open so that, in processing, the processing gas generally flows upwardly within the liner 20 and out the top of the liner 20 before descending downwardly around the outside of the liner 20 to the vacuum pump. The heater canister 12, bell jar 16, and liner 20 may be raised vertically to allow wafers to be transferred to and from the tower 22, although in some configurations these elements remain stationary while an elevator raises and lowers the pedestal 24 and loaded tower 22 into and out of the bottom of the furnace 10.

The bell jar 16, which is closed on its upper end by the dome 18, produces a generally uniformly hot temperature in the vertically middle and upper portions of the furnace 10. This is referred to as the hot zone in which the temperature is controlled for the optimized thermal process. However, the open bottom end of the bell jar 16 and the mechanical support of the pedestal 22 causes the lower end of the furnace 10 to have a lower temperature, often low enough that the thermal process such as chemical vapor deposition is not effective. The hot zone may exclude some of the lower slots of the tower 22.

Conventionally in low-temperature applications, the tower, liner, dome, and injectors have been composed of quartz, typically fused silica. However, quartz towers, liners, and injectors are being supplanted by silicon towers, liners, and injectors. Towers of silicon carbide are also available. Silicon towers having somewhat different configurations for various applications and silicon injectors are commercially available from Integrated Materials, Inc. of Sunnyvale, Calif. and are disclosed respectively by Boyle et al. in U.S. Pat. No. 6,450,346 and by Zehavi et al. in U.S. patent application Ser. No. 11/177,808, filed Jul. 8, 2005 and published as U.S. Patent Application Publication 2006/0185589, now abandoned. Silicon liners based on silicon staves bonded together into a generally tubular (actually polygonal) shape are disclosed by Boyle et al. in U.S. patent application Ser. No. 10/642,013, filed Sep. 26, 2001, published as U.S. Patent Application Publication 2004/0129203, and issued as U.S. Pat. No. 7,137,546, and incorporated herein by reference. A preferred liner design disclosed by Reese et al. in U.S. patent application Ser. No. 11/536,352, filed Sep. 29, 2006 and now published as U.S. Patent Application Publication 2007/0169701, includes generally rectangularly shaped staves having interlocking structures on their shared edges. All these patent references are incorporated herein by reference. Silicon is available in very high purity in the form of virgin polysilicon (electronic grade silicon) and thus contains very low levels of impurities. However, a silicon member is defined as comprising at least 95 at % and preferably at least 99 at % of elemental silicon.

The use of a silicon tower, a silicon liner, and silicon injectors allows the hot zone to include only silicon parts, which substantially reduces contamination and particles. However, it is now believed that the dome 18 of the quartz bell jar 16 generates a significant number of particles in the 0.2 to 1 μm and larger range, which may fall into the open end of the liner 20 and thence onto the tower 22 and its supported wafers regardless of the composition of the liner 20 and tower 22. Any die on which a particle falls is likely to be inoperable or at least undependable. That is, particles severely affect yield. However, sealing the upper end of the liner 20 would prevent process gas from the injectors 34 from flowing in a regular pattern past the tower 22 and its supported wafers 34.

SUMMARY OF THE INVENTION

A broad aspect of the invention includes a cover for a liner used in thermal substrate processing for accommodating a tower supporting multiple substrates in a vertical arrangement. The cover allows a substantial flow of process gas therethrough while blocking most particles from falling to within the liner. The cover may include apertures having an area of no more than 10% of the surface area of the cover or the opening of the liner. The liner and cover may be composed of quartz, silicon carbide, or silicon, preferably both of the same material.

The apertures, not necessarily limited by the above area limitation, preferably extend horizontally transverse to the vertical axis of the tower and liner and the cover has no apertures extending completely vertically therethrough. The apertures may be in the form of a baffle or may form convolute passageways having at least one right angle turn.

In another embodiment, the apertures may extend vertically with the 10% or even smaller surface limitation.

Advantageously, the baffled structure attached to the cover fits within an central aperture in the upper end plate of the tower.

DETAILED DESCRIPTION OF THE PREFERRED EMBODIMENTS

Figure 1:
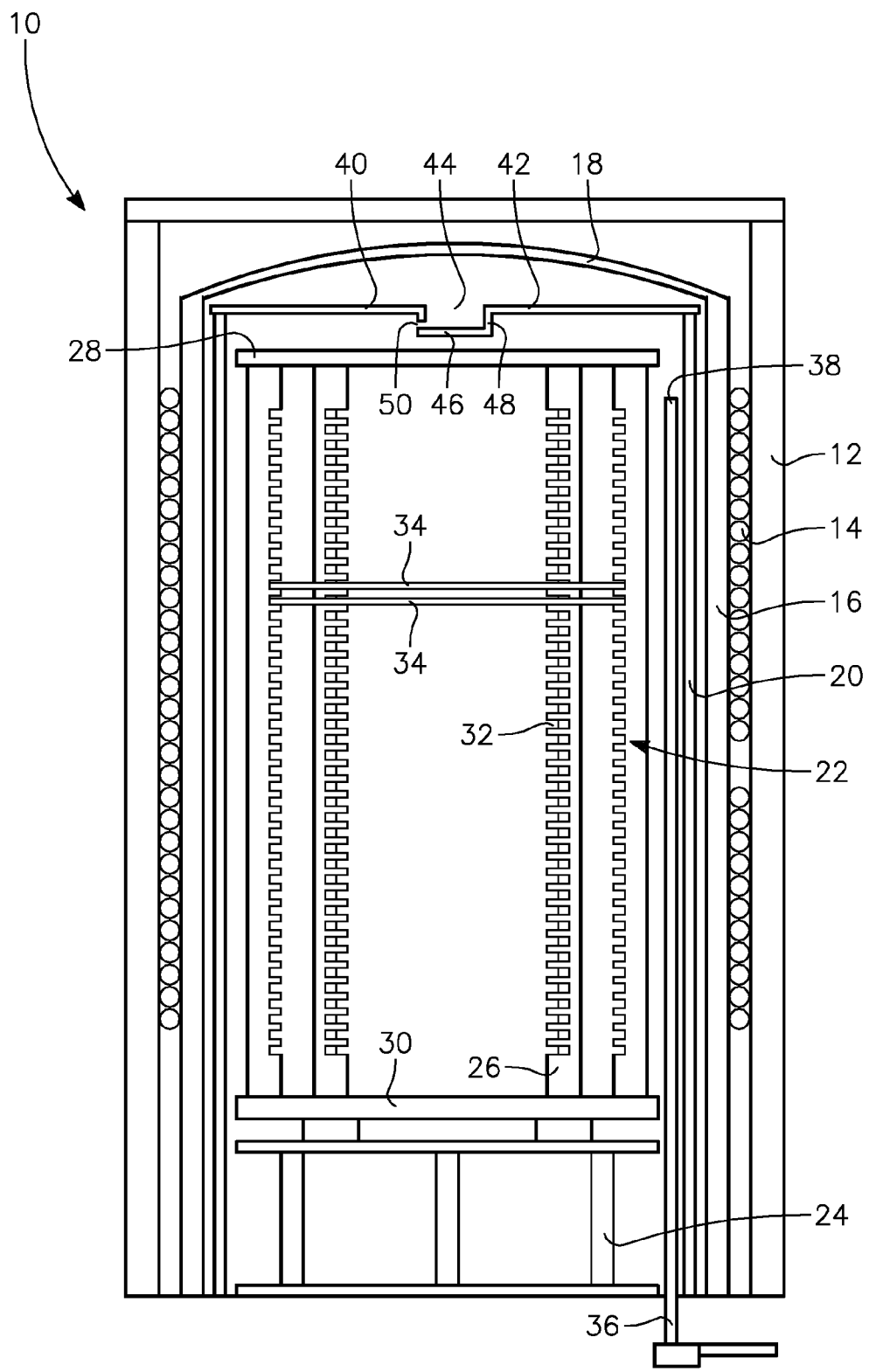
FIG. 1 is a side cross-sectional view of a thermal processing furnace and various parts contained therein and including one embodiment of the invention

One aspect of the invention includes, as illustrated in the partially sectioned elevational view of FIG. 1 and which has already been partially described, a cover 40 disposed over the top of the liner 20 that catches falling particles but allows a regular flow of processing gas between the interior of the liner 20 and the top of the furnace 10. The cover 40 of the embodiment of FIG. 1 includes a generally planar top disk 42 supported on its periphery on the liner 20 and having a large central aperture 44 generally arranged around the central axis of the tower 22 and its supported wafers 34. A horizontally extending floor 46 is suspended from the top disk 42 by sidewalls 48. A plurality of horizontally extending baffle holes 50 penetrate the sidewalls 48 to provide restricted gas flow between the interior of the liner 20 and the exterior.

The gas injector 34 injects processing gas into the interior of the liner 20 and the unillustrated vacuum pump at the bottom of the apparatus pumps from the exterior of the liner 20 so that the processing gas flows radially inward through the baffle holes 50 from the interior to the exterior of the liner 20. Heavy particles falling from the dome 18 of the bell jar fall either onto the top disk 42 or onto the floor 46. Lighter particles may be entrained in the flow of processing gas but the radially inward gas flow through the baffle holes 50 prevents their entry into the interior of the liner 20 and onto the tower 22 and wafers 34 supported on it. In this embodiment, no holes extend vertically through the cover 40 to allow particles to fall directly into the interior of the liner 20.

Figure 2:
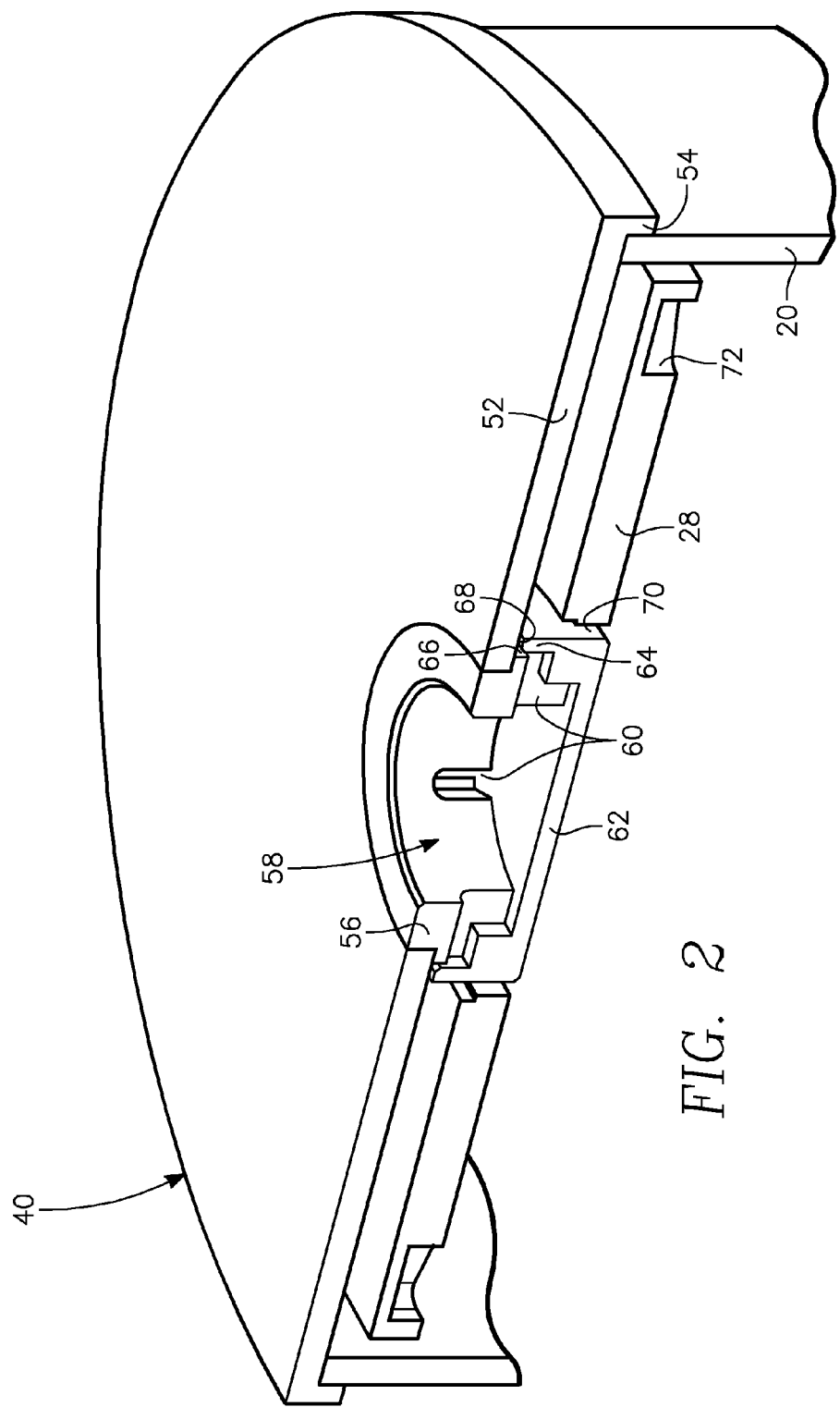
FIG. 2 is a sectioned side view of a liner cover according to a second embodiment of a liner cover of the invention.

A second embodiment illustrated in the sectioned orthographic view of FIG. 2 includes a cover 40 of three parts, preferably bonded together. An annular disk-shape cover plate 52 is generally circularly symmetric about a central axis of the oven 10. In operation, the cover plate 52 is placed on top of the liner 20 in opposition to the bell jar dome 18. It may include an optional dependent outer rim 54 that fits around the liner 20 such that the liner 20 supports and aligns the cover plate 52 but, in this embodiment, is not bonded to it. The rim 54 could be replaced by an annular groove or notch at the bottom of the top plate 52 to capture the top of the liner 20. A central aperture of the cover plate 52 accommodates and is sealed to a castellated baffle member 56 having a central bore 58 open to the space between the cover 40 and the bell jar dome 18. Multiple passageways 60 extend horizontally and radially outwardly from the vertical axis of the central bore 58. The bottom of the baffle member 56 is fixed to a floor member 62 having an upwardly extending rim 64 forming an inverted cup shape that defines a convolute gas flow path radially outwardly through the passageways 60, axially upwardly through an annular vertically extending gap 66 between the outside of baffle member 58 and the inside of the rim 64 and annular radially outwardly extending gap 68 between the top of the rim 64 and the bottom of the cover plate 52 before entering the processing space within the liner 20. However, the processing gas flows in the opposite direction from the processing space within the liner 20 to the central bore 58 effectively outside the liner 20. The convolute gas passageway includes three right-angle turns.

The top plate 28 of the wafer support tower 22 includes a central aperture 70 which accommodates the floor member 62 and the lower portions of the baffle member 58 of the cover 40, thereby saving vertical space in the furnace 10. Mortise holes 72 in the tower top plate 28 accept the legs 24 of the tower 22, which are bonded to the tower top plate 28.

The cover plate 52, baffle member 56, and floor member 62 in one embodiment are composed of silicon, preferably virgin polysilicon, bonded together with the composite adhesive of spin-on glass and silicon powder disclosed by Boyle et al. in U.S. patent application Ser. No. 10/670,990, filed Sep. 25, 2003, published as U.S. Patent Application Publication 2004/0213955, and issued as U.S. Pat. No. 6,083,694.

Most of the particles falling from the bell jar dome 18 fall upon the cover plate 52 and remain there. Most of the heavier particles that fall into the bore 58 of the baffle member 56 fall upon the exposed top surface of the floor member 62 and remain there. In processing, the process gas generally flows from the vicinity of the tower through a convolute passage including the gaps 64, 66 between the upwardly extending rim 54 of the floor member 62 and the outer sides of the castellated member 46 before flowing radially inward through the passageways 60 into the bore 58 of the baffle member 56 and then upwardly toward the top of the bell jar 16. As a result, the flow tends to entrain any unsettled particularly lighter particles and sweep them away from the interior of the liner 20. The entrainment is enhanced by the increased flow velocity through the restricted passages.

The liner 20 is illustrated in FIG. 2 as a circular tubular member. However, silicon liners have been developed in which the liner is formed by generally rectangular staves bonded together around their edge to form a polygonal tubular member.

The cover 40 may be bonded to the liner 20 or may be freely supported by it. The latter configuration simplifies cleaning and maintenance of the liner 20 and cover 40. The latter configuration may change the structure of the engagement at the periphery of the cover plate 52.

Figure 3:
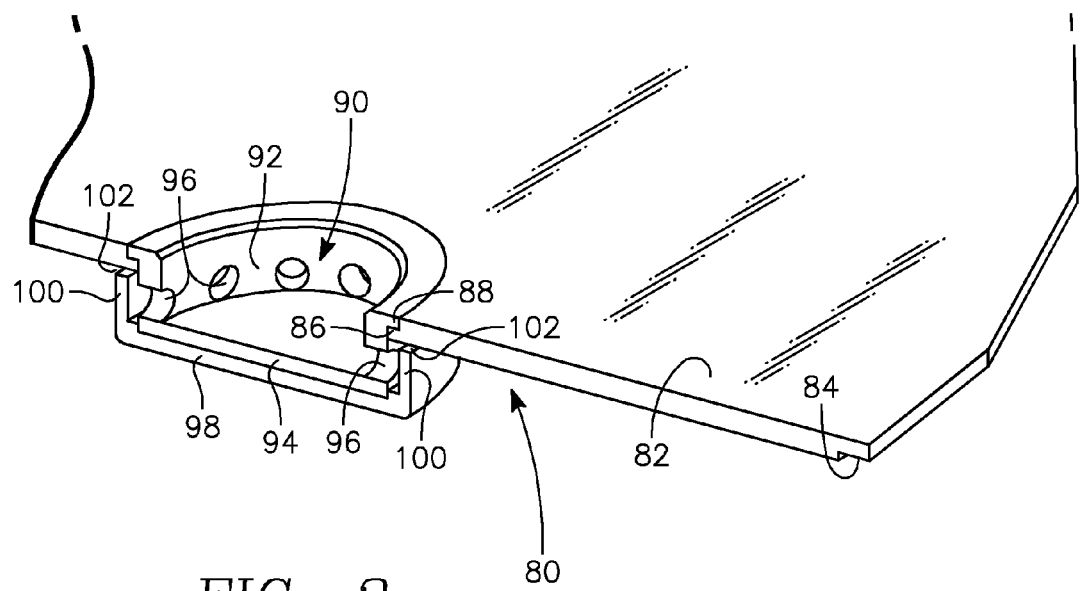
FIGS. 3 and 4 are sectioned orthographic views of a liner cover according to a third embodiment of the invention.
Figure 4:
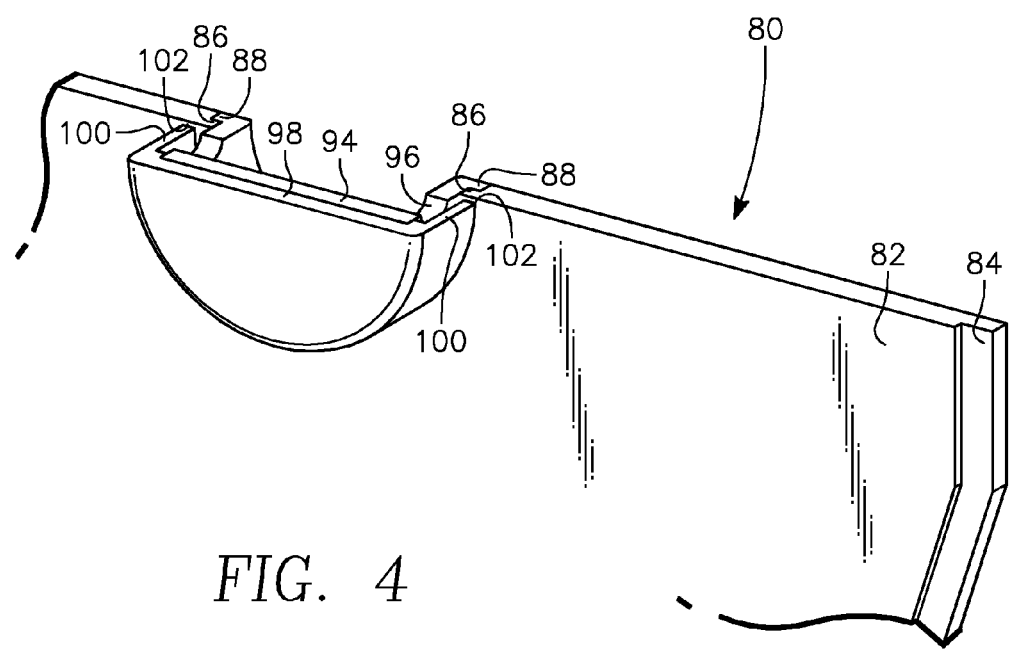

A cover 80 of a related embodiment is illustrated in the sectioned orthographic views of FIGS. 3 and 4 viewed respectively from above and below. The cover 80 includes a generally disk-shaped top plate 82 having a polygonal outer shape in conformity with the polygonally arranged staves of the liner 20. A planar peripheral notch 84 allows the top plate 82 to be supported on and aligned by the staves of the liner 20. The top plate 82 includes a central aperture having an annular inner and lower lip 86, which supports an outer rim 88 of a cup 90. Preferably, the cup 90 is bonded to the top plate 82 at the interface between the lip 86 and the rim 88. An axially extending tubular sidewall 92 suspends a horizontally extending bottom 94 from the rim 88 and includes a plurality of radially extending holes 96. An inverted cap 98 is bonded to the bottom 94 of the cup 90 and includes an upwardly extending annular flange 100, which defines an annular convolute passageway 102 between it and the bottom of top plate 82 and the outer surface of the sidewall 80. The cover 80 exhibits similar gas flow, particle exclusion, and fit with the tower as does the cover 40 of FIG. 2.

Figure 5:
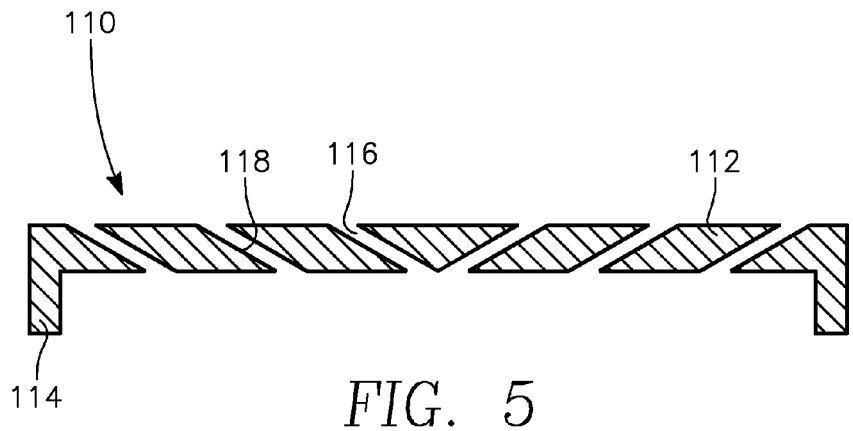
FIGS. 5, 6, and 7 are cross-sectional views of liner covers according to fourth, fifth, and sixth embodiments of the invention.

A simpler liner cover 110, illustrated in the cross-sectional view of FIG. 5, includes a disk-shaped top plate 112 having a dependent rim 114 to fit around the top of the liner 20. A plurality of slanted holes 116 inclined to the oven central vertical axis are machined into the top plate 112 such that no vertical path extends in the holes 116 through the top plate 112 parallel to the oven central axis. The holes 116 may be circular in cross section and drilled through the top plate 112. As a result, particles falling form the dome 18 of the bell jar 16 are likely to fall upon and stick to either the top surface of the top plate 112 or lower surfaces 118 of the slanting holes 116. As mentioned previously, the processing gas flows generally upwardly, that is, in the generally upward direction through the slanted holes 116 so that it tends to entrain particles and carry them away from the interior of the liner 20.

Figure 6:
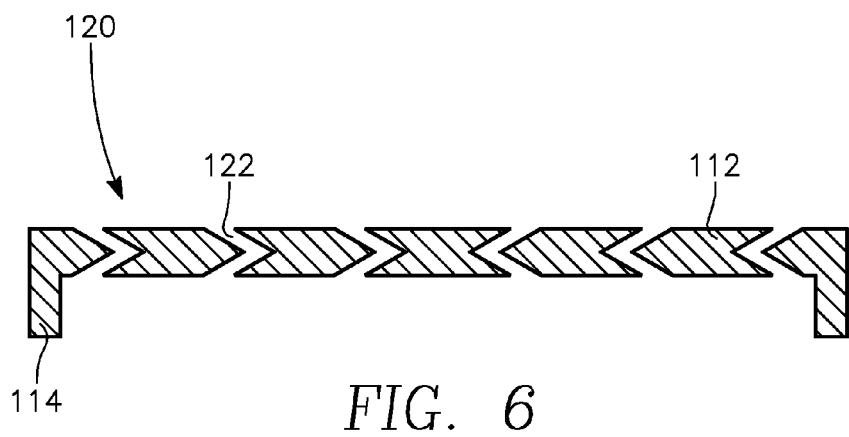

A liner cover 120 of a related embodiment of the invention, illustrated in the cross-sectional view of FIG. 6, is similar to that of FIG. 5. It includes chevron-shaped holes 122 extending through the top plate 114 and having an acute turn in the middle of the top plate 112 between portions of the holes 122 slanting in opposite directions. The holes 122 may have circular cross section and be drilled from either side of the top plate 112 to meet near the middle. In either embodiment of FIGS. 5 and 6, the dependent rim 114 may be replaced by a generally annular notch at the lower outer periphery to provide similar alignment on the top of the liner 20.

Figure 7:
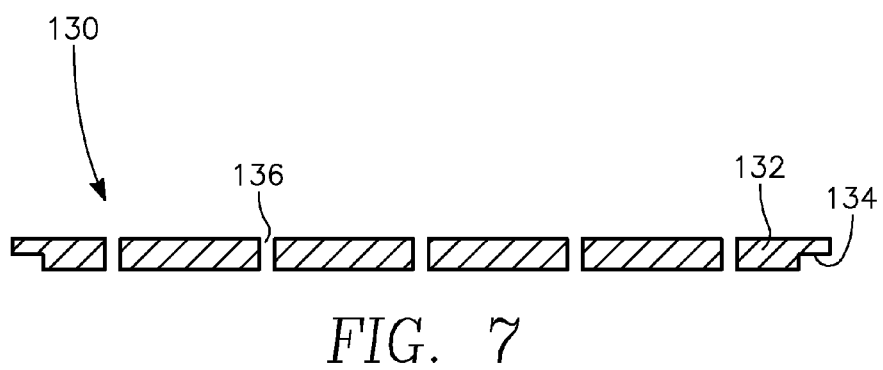

A yet simpler liner cover 130, illustrated in the cross-sectional view of FIG. 7, includes a generally disk-shaped planar top plate 132 having a lower outer peripheral notch 134 for support and alignment on the top of the liner 20. The top plate 132 also includes a plurality of vertical holes 136 through it to provide fluid communication between the interior and the exterior of the liner 20. The vertical holes 136 occupy a small fraction of the surface area at the top of the liner 20, no more than 10% and preferably less than 5%. However, in order to not excessively impede the fluid flow, the vertical holes 136 should occupy at least 0.5% and preferably at least 1% of the surface area of the top of the liner 20. These fractions may alternatively be expressed as the cross-sectional area of the cover itself. Again, the holes 136 may have circular cross section and be drilled. Most of the particles fall from the dome strike the unapertured portions of the top surface of the top plate 132 and stick there. Those particles falling in the area of the holes 136 encounter the increased gas flow through the constricted holes 136. Some of the heavier falling particles may nonetheless fall through the holes 134 and enter the processing space. However, their number is greatly reduced over the design of an open liner top.

For an all-silicon hot zone, the parts of the cover are preferably similarly silicon parts, which may the virgin polysilicon used for the silicon tower and liner be fused together by the same composite SOG/silicon adhesive used for the tower and liner. However, other types of silicon such as Czochralski and cast silicon may be substituted with little effect on the process. Not only is a silicon cover composed of pure material, there is minimal thermal expansion differentials between the cover and the supporting liner. The large silicon top plate, especially that required for 300 mm processing, may be formed of multiple smaller silicon bars bonded together at their lateral edges through an interlocking joint with a adhesive of a composite of a silica spin on glass and silicon powder, as described by Reese et al. in the aforecited patent application. Such an approach enables the economic fabrication of large covers with very pure virgin polysilicon.

However, the invention is not limited to silicon parts forming the tower, liner, and cover. The invention can be advantageously applied to other materials, such as quartz and silicon carbide including silicon-impregnated silicon carbide, which preferably have a composition such that the particle production of the parts is less than that of the roof and other parts of the oven. It is nonetheless preferred that the liner and cover have the same composition to eliminate differential thermal expansion and the rubbing of the cover against the liner as the parts are heated and cooled.

The invention claimed is:

1. A liner assembly for use in a thermal processing furnace, comprising:
   a generally tubular liner having sides extending along a central axis for accommodating a tower supporting a plurality of wafers in a horizontal orientation; and
   a cover disposed at least partially over a top of the liner having convolute passageways passing therethrough, part of the passageways extending perpendicular to the central axis and another part of the passageways extending parallel to the central axis, wherein the cover includes an outer annular portion supported on the liner and a central part having an inner annular portion fit into a central aperture of the outer annular portion, and a floor member having an upwardly extending rim forming an inverted cup shape, and the passageways penetrating sidewalls of the central part and passing in between the central part and the upwardly extending rim.

2. The assembly of claim 1, wherein the cover is not fixed to the liner.

3. The assembly of claim 1, wherein the cover is fixed to the liner.

4. The assembly of claim 1, wherein the liner and cover consist of at least 99 at % silicon.

5. The assembly of claim 1, wherein the liner and cover comprise at least one multi-component silicon-containing material selected from the group consisting of quartz and silicon carbide.

6. The assembly of claim 1, wherein the cover fits partially within a central aperture of a top plate of the tower fixed to legs of the tower on which the wafers are supported.

7. The assembly of claim 1, wherein the outer annular portion includes a planar portion and a rim descending therefrom.

8. The liner assembly of claim 1, wherein the cover includes a continuous floor extending through and perpendicularly outwardly from the central axis at an axial position below the passageway axes and being exposed to a top of the thermal processing furnace.

9. A baffled liner cover to be fit over the top of a tubular liner configured to accommodate within the liner a substrate support tower, comprising:
   a cover plate extending in a plane about an axis and having peripheral edges to be supported on the liner and having a central aperture;
   a baffle assembly having an annular portion at its top fit to the aperture, a generally tubular wall open at its top in a plane of the cover plate, extending parallel to the axis, and having horizontal passageways therethrough, and supporting at its bottom a continuous floor extending perpendicularly to and radially outwardly from the axis, the floor having an upwardly extending rim, and a convolute gas passageway joined to the horizontal passageways formed in between the tubular wall and the cover plate.

10. The cover of claim 9, wherein the baffle assembly further comprises an annular flange connected to an outer portion of the floor and extending upwardly toward the cover plate and creating an annular vertical passageway between it and the tubular wall adjacent the horizontal holes and a connected annular horizontal passageway between it and a bottom of the cover plate.

11. The cover of claim 10, wherein the cover plate and the baffle assembly both comprise a multi-component silicon-containing material selected from the group consisting of quartz and silicon carbide.

12. The cover of claim 10, wherein the cover plate and the baffle assembly both comprise a material which is silicon.

13. The cover of claim 9, wherein the cover plate and the baffle assembly comprises a multi-component silicon-containing material selected from the group consisting of quartz and silicon carbide.

14. The cover of claim 9, wherein the cover plate and the baffle assembly both comprise a material which is silicon.

15. The liner assembly of claim 9, further comprising the tower which includes legs supporting the wafers and fixed to a top plate having a central aperture accommodating therein lower portions of the baffle assembly.

16. The liner assembly of claim 9, wherein the floor extends through the axis and is exposed to a space over the tubular liner.

\* \* \* \* \*